United States Patent
Chen et al.

(10) Patent No.: US 8,531,845 B2
(45) Date of Patent: Sep. 10, 2013

(54) STRUCTURE OF ANTI TAMPER CASE FOR SOLID STATE DISK

(75) Inventors: Wei-Hau Chen, New Taipei (TW); Chen-Chia Pai, New Taipei (TW); Tien-Chen Huang, New Taipei (TW); Cheng-Hsien Kuo, New Taipei (TW)

(73) Assignee: Comptake Technology Inc., New Taipei (TW)

( * ) Notice: Subject to any disclaimer, the term of this patent is extended or adjusted under 35 U.S.C. 154(b) by 360 days.

(21) Appl. No.: 13/074,107

(22) Filed: Mar. 29, 2011

(65) Prior Publication Data
US 2012/0250271 A1    Oct. 4, 2012

(51) Int. Cl.
*H05K 5/00*    (2006.01)

(52) U.S. Cl.
USPC ............................. 361/752; 361/801; 361/803

(58) Field of Classification Search
USPC ................... 361/728–732, 752, 796, 679.02, 361/737, 740, 800–803; 439/76.1, 353
See application file for complete search history.

(56) References Cited

U.S. PATENT DOCUMENTS

| | | | | |
|---|---|---|---|---|
| 4,912,602 A * | 3/1990 | Zurek et al. | | 361/752 |
| 5,144,533 A * | 9/1992 | Annett | | 361/740 |
| 5,548,483 A * | 8/1996 | Feldman | | 361/737 |
| 5,886,402 A * | 3/1999 | Onoda et al. | | 257/679 |
| 6,155,863 A * | 12/2000 | Matsuzaki et al. | | 439/353 |
| 6,166,913 A * | 12/2000 | Fun et al. | | 361/737 |
| 6,628,524 B1 * | 9/2003 | Washino et al. | | 361/737 |
| 6,853,550 B2 * | 2/2005 | Tseng et al. | | 361/679.02 |
| 7,301,776 B1 * | 11/2007 | Wang et al. | | 361/737 |
| 8,206,161 B1 * | 6/2012 | Lan et al. | | 439/76.1 |
| 8,243,456 B2 * | 8/2012 | Tochi et al. | | 361/737 |

\* cited by examiner

*Primary Examiner* — Hung S Bui
(74) *Attorney, Agent, or Firm* — Chun-Ming Shih; HDLS IPR Services

(57) ABSTRACT

A structure of an anti tamper case for the solid state disk includes an upper housing and a lower housing. The upper housing has an extending portion formed respectively on the two sides of the flange. The extending portion has at least one opening. The lower housing corresponds to the upper housing and a space is formed there-between for receiving the solid state disk. The lower housing has a hook formed at the flange corresponding to the opening. The hook and the opening are buckled to each other. The hook will be broken by the flange in the opening when the upper and lower housings are separated, thus prevent the user from forcefully opening the case for self maintenance or internal component replacement.

6 Claims, 8 Drawing Sheets

US 8,531,845 B2

STRUCTURE OF ANTI TAMPER CASE FOR SOLID STATE DISK

BACKGROUND

1. Technical Field

The present invention relates to a structure of an anti tamper case. More particularly, the present invention relates to a structure of an anti tamper case for the solid state disk.

2. Related Art

Along with vigorously developed technologies, various types of electronic devices are widely used in users' daily lives. The constantly improved technologies enable the devices to be lighter, thinner, shorter and smaller size, for example, the hard disk and the CD ROM to provide convenience of portability. In order to benefit from the portable device, a plurality of cases housing the electronic components with four sides are commonly applied, requiring capping the top, plug-in, fitting or threading with other elements to complete a case, and the ultimate purpose is to protect the electronic device.

In order to prevent the user from opening the case to replace the internal components of the electronic device or to process self-maintenance that may cause damage to the electronic device or induce further undesirable problems, the electronic devices usually have fragile stickers adhered at the joint portion to identify whether the electronic device have been opened.

However, the sticker on the product substantially affects the appearance of the electronic device, and the fragile sticker doesn't have the sophisticated fraud-proof function; therefore, there is possibility of success in replacing the internal components of the electronic device if any user intends to do so. Besides, the fragile stickers usually are made of thin material, thus damage caused by the frictions during carriage is very common. To avoid damaging the sticker, the user has to be extremely careful during carrying, moving or even using the electronic device can be really inconvenient. According to the above depiction, the design of the conventional fragile sticker for anti tamper purpose is not perfect, and thus the range of internal components replacement is substantially limited.

BRIEF SUMMARY

The present invention provides a structure of anti tamper case for the solid state disk including a buckling hook at the opening portion such that rupturing of the hook occurs if the user opens the upper and the lower housing. Thus to effectively prevent the user from opening the case for maintenance or replacing the internal component.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
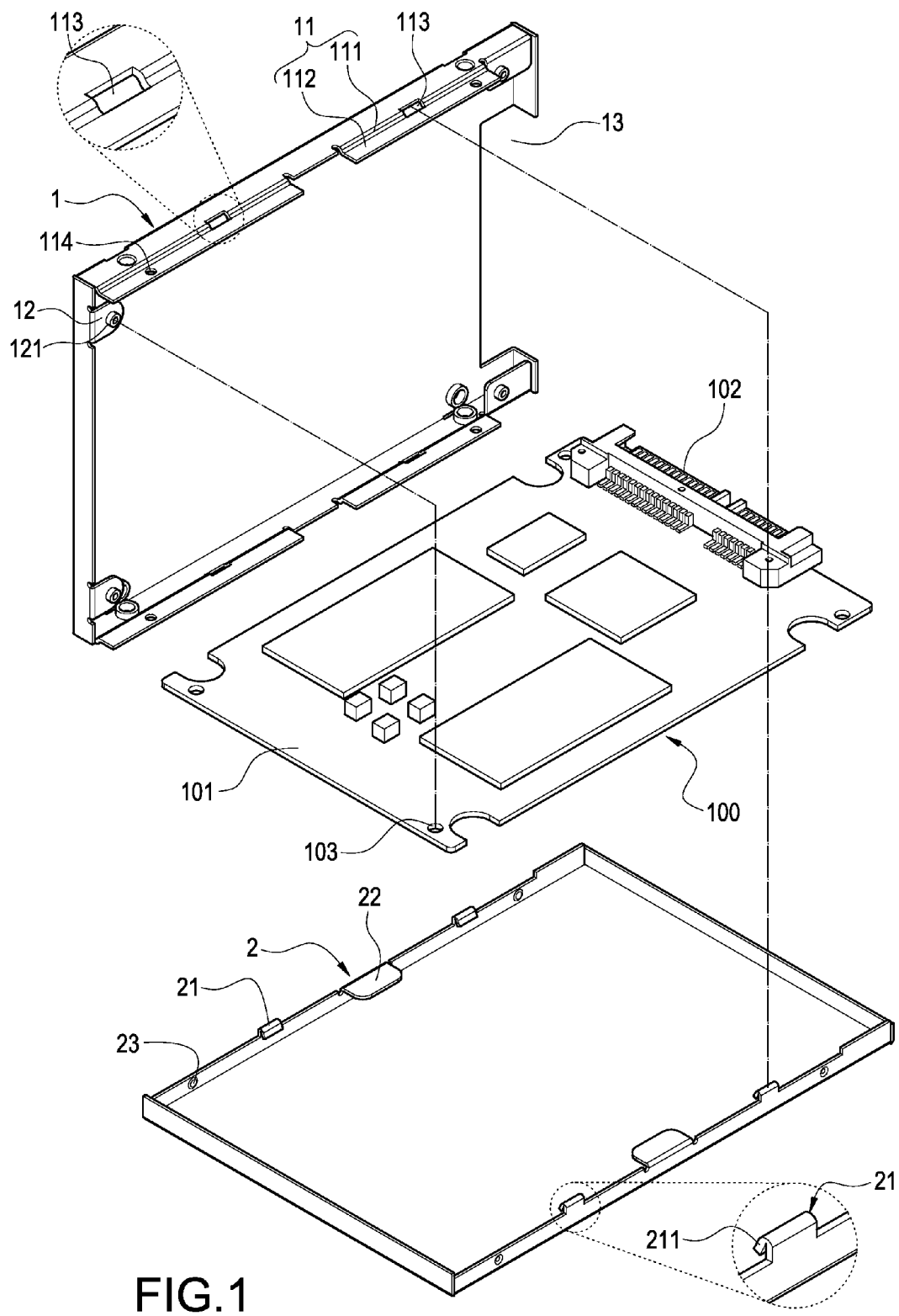
FIG. 1 is an exploded view of a structure of the anti tamper case according to an embodiment of the present invention.

Referring to FIG. 1, the present invention provides a structure of an anti tamper case for a solid state disk. The solid state disk 100 comprises a storage unit, a circuit board 101 and a connection port 102. The circuit board 101 comprises a plurality of holes 103. The structure of the anti tamper case comprises an upper housing 1 and a lower housing 2.

The upper housing 1 is formed in a rectangular shape but the shape is not intended to restrict the scope of the present invention. The upper housing 1 comprises an extending portion 11 respectively on the two sides of the flange. The extending portion 11 comprises a bent portion 111 and an inward portion 112 extending from the bent portion 111. The extending portion 11 comprises at least one opening 113 as shown in FIG. 1. The upper housing 1 comprises a plurality of openings 113 formed in the bent portion 111 and a plurality of holes 114 in the inward portion 112. The upper housing 1 comprises a plurality of positioning portions 12 protruding towards the inner portion from the flange. Every positioning portion 12 comprises a protrusion 121. A groove 13 is formed on a side of the upper housing 1.

The lower housing 2 is formed in a rectangular shape corresponding to the shape of the upper housing 1, but the shape is not intended to restrict the scope of the present invention. The lower housing 2 comprises a hook 21 formed at a flange thereof corresponding to the opening 113. The hook 21 is formed in a V shape corresponding to the upper housing 1, but the shape is not intended to restrict the scope of the present invention. The hook 21 comprises a bent portion 211. The lower housing 2 has a plurality of contacting portions 22 protruding towards inner portion from the flange. A protrusion 23 is formed at the flange of the lower housing 2 corresponding to the hole 114.

Figure 2:
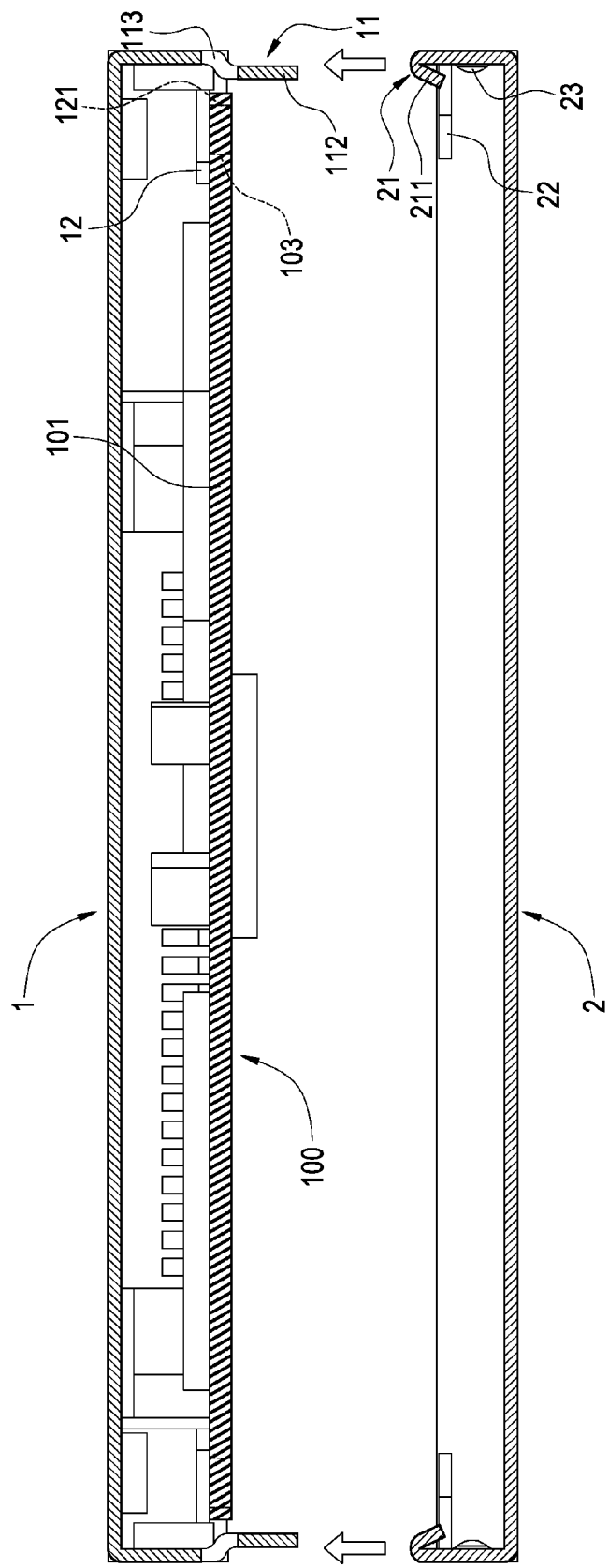
FIG. 2 is an aspect of an assembly of a structure of the anti tamper case according to an embodiment of the present invention.

Referring to FIG. 2, to assembly the structure of anti tamper case in the present invention, first join the upper and the lower housing 1, 2 to form a space 3 for receiving the solid state disk 100; fit every protrusion 121 into corresponding the holes 103 to position the circuit board 101 to the positioning portion 12 and have the contacting portion 22 secure the circuit board 101. Thus the circuit board 101 is clamped between the positioning portion 12 and the contacting portion 11 to further secure the solid state disk 100 in the space 3. Accordingly the embodiment of the present invention provides an simple assembly procedure for the anti tamper case that can be conveniently implemented in an automation production. The solid state disk 100 can be in a secured position in the space 3 during carriage.

Figure 3:
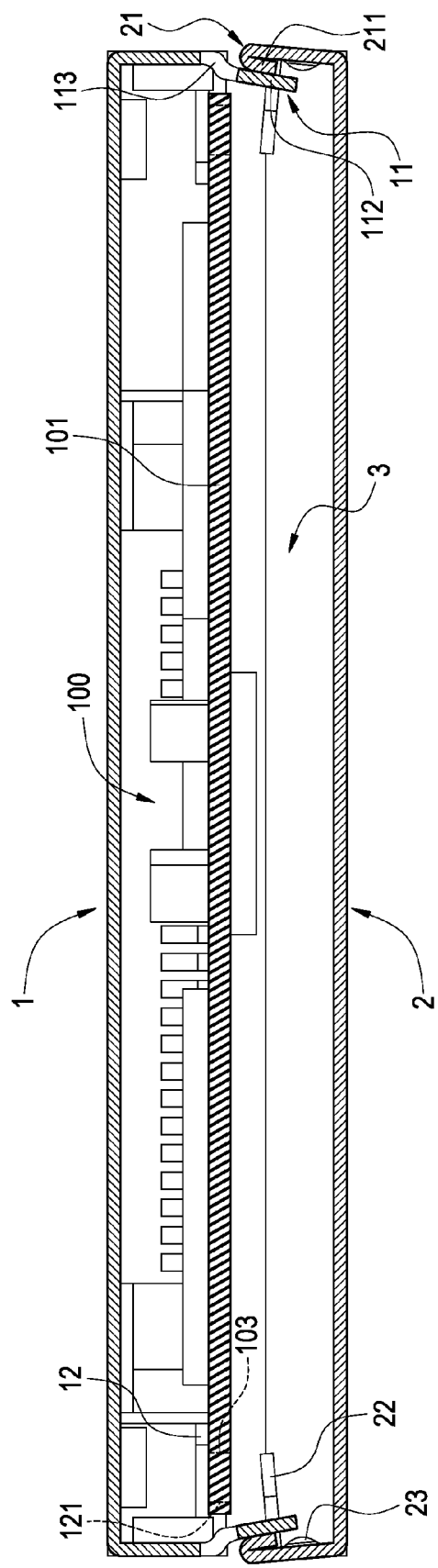
FIG. 3 is another aspect of an assembly of a structure of the anti tamper case according to an embodiment of the present invention.
Figure 4:
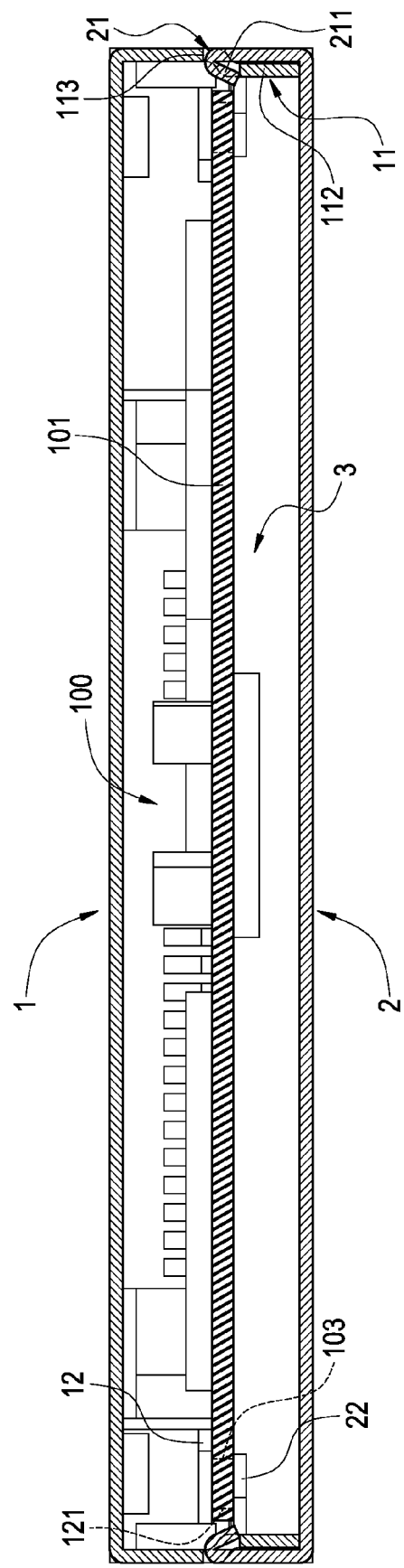
FIG. 4 is a sectional view of a structure of an anti tamper case according to an embodiment of the present invention.

Referring to FIGS. 3 to 4, to assemble the upper housing 1 and the lower housing 2, the inward portion 112 and the hook 21 must be pushed against each other by pressing the bent portion 211 towards the flange of the lower housing 2 so that the inward portion 112 will be elastically transfigured towards the space 3, and the hook 21 and the inward portion 112 stop pushing against other when all of hook 21 reach the opening 113 to allow the bent portion 211 buckle to the opening 113. Furthermore, after the upper housing 1 join the lower housing 2, the positioning portion 12 and the contacting portion 22 support the circuit board 101 to reduce the impact as the solid state disk 100 is being held by the positioning portion 12 and the contacting portion 22 when the anti tamper case of the present invention is subjected to shock.

Figure 5:
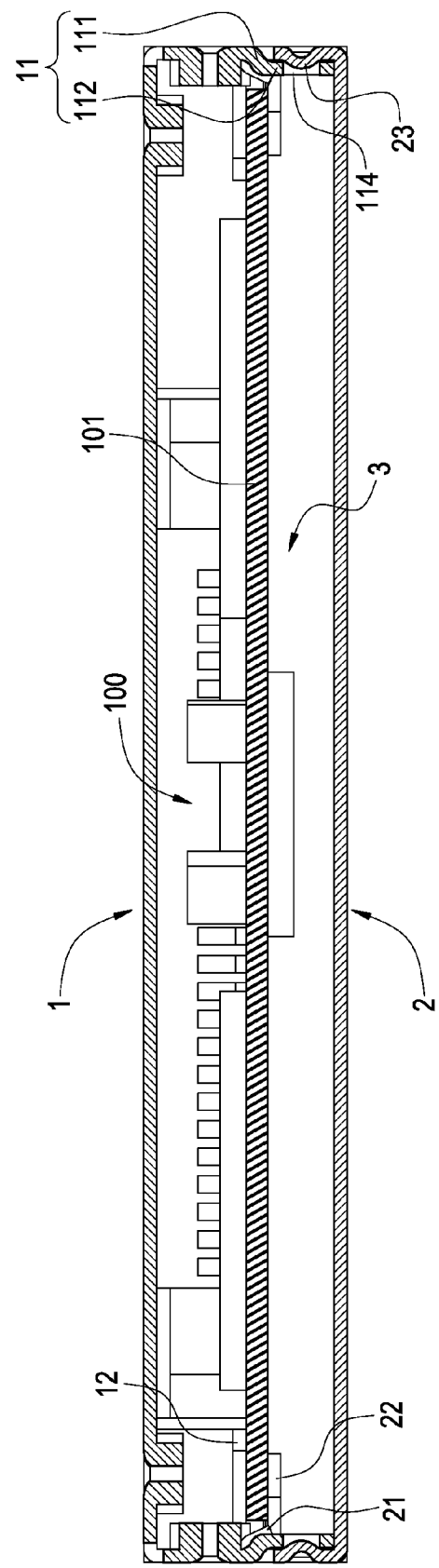
FIG. 5 is another sectional view of a structure of the anti tamper case according to an embodiment of the present invention.

Referring to FIG. 5, holes 114 are formed in the inward portion 112 of the upper housing 1 and protrusions 23 corresponding to the holes 114 are formed on the flange of the lower housing 2, The protrusions 23 and the holes 114 are buckled to each other to assemble the upper and the lower housings 1, 2.

Figure 6:
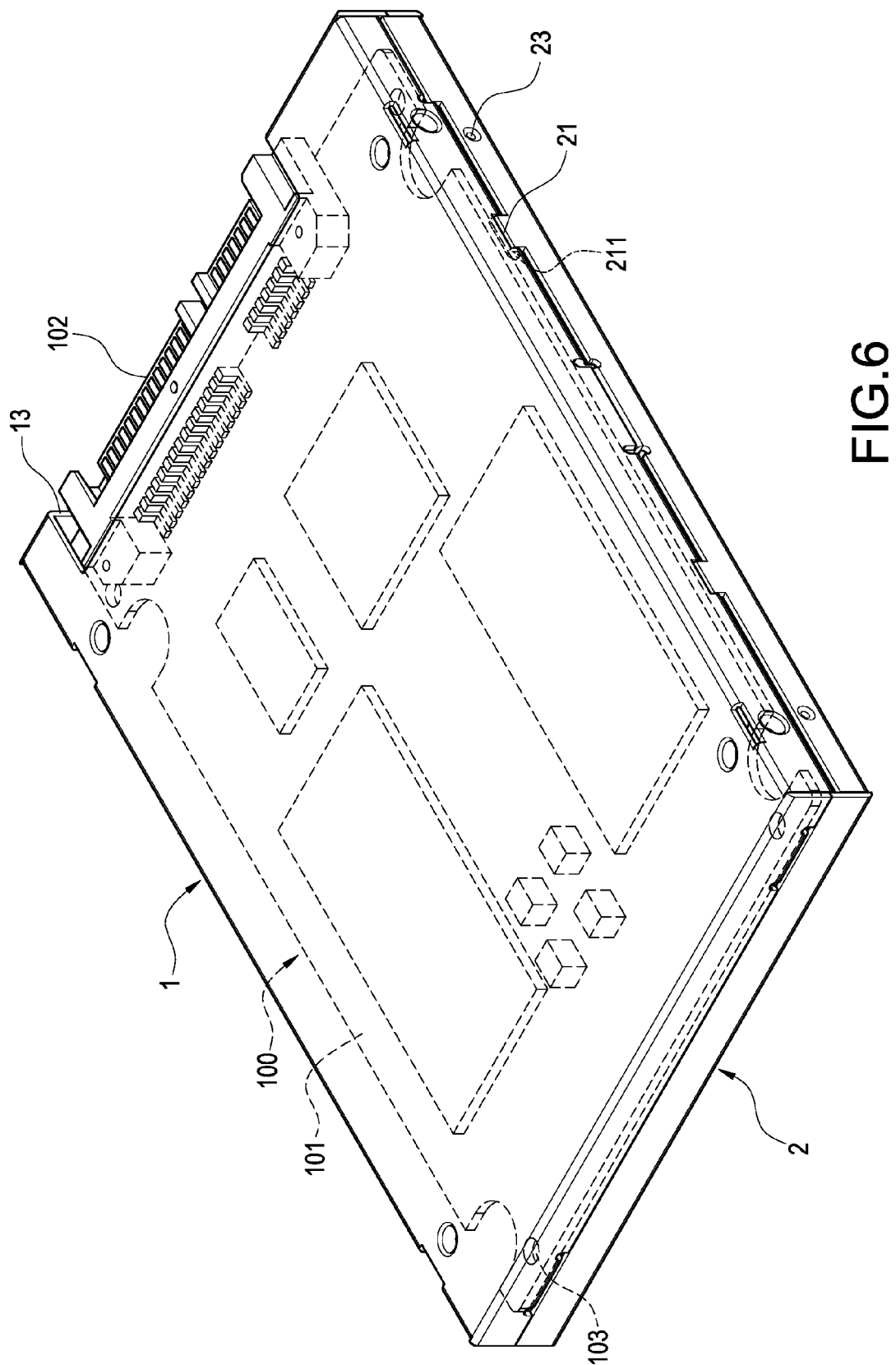
FIG. 6 is a perspective view of a structure of the anti tamper case according to an embodiment of the present invention.

Referring to FIG. 6, the assembly of the upper and lower housings 1, 2 shows no junction; in the anti tamper case of the present invention, all the elements for buckling to one another are all within the space enclosed by the inner portion of the upper and the lower housings 1, 2, and thus does not affect the appearance of the anti tamper case of the present invention. Moreover, the solid state disk 100 can be used directly via the connector exposed out of the upper housing 1 in the opening 13.

Figure 7:
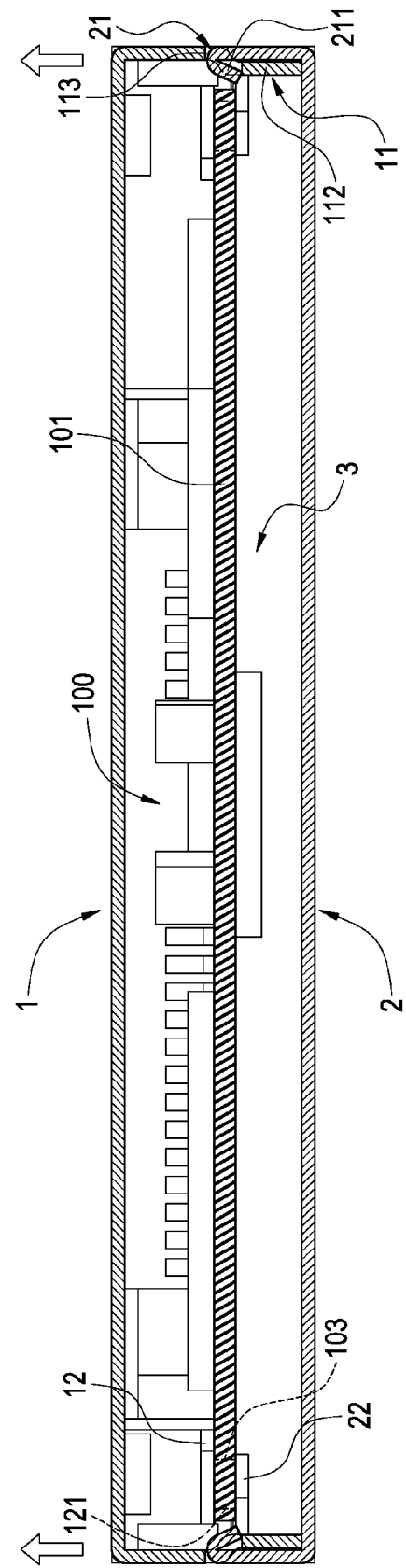
FIG. 7 is an operation aspect of a structure of the anti tamper case according to an embodiment of the present invention.
Figure 8:
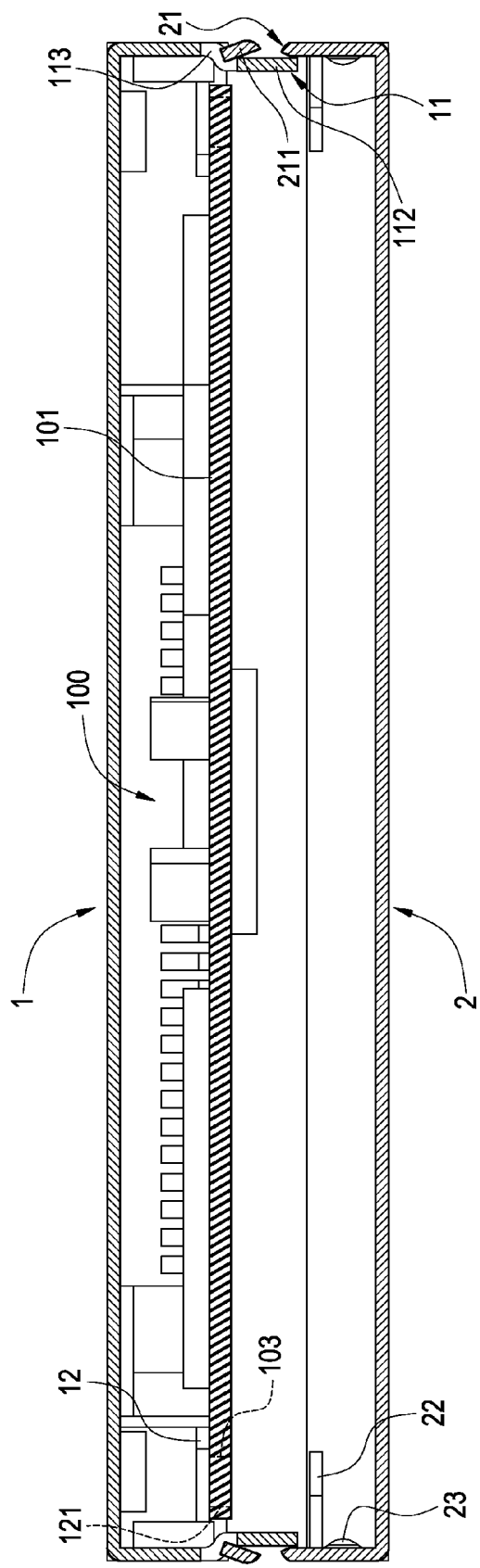
FIG. 8 is another operation aspect of a structure of the anti tamper case according to an embodiment of the present invention.

Referring to FIGS. 7 to 8, after assembly of the upper and the lower housing 1, 2 and the bent portions 211 and the openings 113 are buckled to each other, and if the upper housing 1 is removed from the lower housing 2, the inward portion 112 will buckle to the bent portion 211 thus to prevent the user opening the anti tamper case. However, if the user forces to open the anti tamper case of the present invention, the hook 21 will be held by the flange of the opening 113 and the bent portion 211 will be pushed and broken by the inward portion 122, and accordingly the upper housing 1 and the lower housing 2 will be separated from each other. Thus by observing whether the bent portion 211 of the hook 21 is broken, it can be judged whether the user forcefully opened the anti tamper case of the present invention, and thus the user's self maintenance can be avoided in order to ensure the quality of the solid state disk 100.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A structure of an anti tamper case for a solid state disk, comprising:
    an upper housing, having an extending portion respectively formed on two sides of flange, wherein said extending portion comprises at least one opening; and
    a lower housing, corresponding to said upper housing enclosing a space there-within for receiving said solid state disk; wherein said lower housing comprises a hook on a flange corresponding to said opening, and said hook and said opening are buckled to each other, and wherein when said upper housing and said lower housing are separated, said hook is broken by a flange in said opening,
    wherein said extending portion comprises a bent portion and said opening is formed in said bent portion, and
    wherein said extending portion comprises an inward portion extending from said bent portion; said hook comprises a bent portion corresponding and buckling to said opening and buckled by said inward portion.

2. The structure of an anti tamper case for a solid state disk according to claim 1, wherein said upper housing comprises a plurality of positioning portions formed on said flange protruded towards inner portion; said every positioning portion comprises a protrusion; said solid state disk comprises a circuit board having a plurality of holes to receive said protrusion.

3. The structure of an anti tamper case for a solid state disk according to claim 2, wherein said lower housing comprises a plurality of contacting portions formed on said flange protruding towards inner portion to hold said circuit board.

4. A structure of an anti tamper case for a solid state disk according to claim 3, wherein said positioning portion and said contacting portion clamp and position said circuit board.

5. The structure of an anti tamper case for a solid state disk according to claim 1, wherein said extending portion comprises a plurality of holes; said lower housing comprises a protrusion positioned at said flange corresponding to said hole; and said protrusion buckles to said hole.

6. A structure of an anti tamper case for a solid state disk according to claim 1, wherein said upper housing comprises a groove, and said solid state disk comprises a connection port exposed out of said upper housing through said groove.

* * * * *